United States Patent
Das et al.

(10) Patent No.: US 9,548,394 B2
(45) Date of Patent: Jan. 17, 2017

(54) ALL 2D, HIGH MOBILITY, FLEXIBLE, TRANSPARENT THIN FILM TRANSISTOR

(71) Applicant: UCHICAGO ARGONNE, LLC, Chicago, IL (US)

(72) Inventors: Saptarshi Das, Willowbrook, IL (US); Anirudha V. Sumant, Plainfield, IL (US); Andreas Roelofs, Wheaton, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 14/692,596

(22) Filed: Apr. 21, 2015

(65) Prior Publication Data

US 2015/0303315 A1    Oct. 22, 2015

Related U.S. Application Data

(60) Provisional application No. 61/982,740, filed on Apr. 22, 2014.

(51) Int. Cl.
*H01L 29/786* (2006.01)
*H01L 29/24* (2006.01)
(Continued)

(52) U.S. Cl.
CPC ......... *H01L 29/78681* (2013.01); *H01L 29/24* (2013.01); *H01L 29/242* (2013.01);
(Continued)

(58) Field of Classification Search
CPC .................. H01L 29/78681; H01L 29/78684; H01L 29/78648; H01L 29/78696; H01L 29/78603; H01L 29/66969; H01L 29/4908; H01L 29/242; H01L 29/24; H01L 29/45
(Continued)

(56) References Cited

U.S. PATENT DOCUMENTS

| 8,513,653 B2 | 8/2013 | Woo et al. |
| 2010/0051907 A1 | 3/2010 | Pfeiffer |

(Continued)

FOREIGN PATENT DOCUMENTS

WO    WO-2012/088334 A1    6/2012

OTHER PUBLICATIONS

Bae, S., et al., "Roll-to-roll production of 30-inch graphene films for transparent electrodes," Nature Nanotechnology, vol. 5, Jun. 20, 2010 pp. 574-578.

(Continued)

*Primary Examiner* — Dao H Nguyen
(74) *Attorney, Agent, or Firm* — Foley & Lardner LLP

(57) ABSTRACT

A two-dimensional thin film transistor and a method for manufacturing a two-dimensional thin film transistor includes layering a semiconducting channel material on a substrate, providing a first electrode material on top of the semiconducting channel material, patterning a source metal electrode and a drain metal electrode at opposite ends of the semiconducting channel material from the first electrode material, opening a window between the source metal electrode and the drain metal electrode, removing the first electrode material from the window located above the semiconducting channel material providing a gate dielectric above the semiconducting channel material, and providing a top gate above the gate dielectric, the top gate formed from a second electrode material. The semiconducting channel material is made of tungsten diselenide, the first electrode material and the second electrode material are made of graphene, and the gate dielectric is made of hexagonal boron nitride.

23 Claims, 5 Drawing Sheets

(51) Int. Cl.
| | |
|---|---|
| H01L 29/15 | (2006.01) |
| H01L 29/66 | (2006.01) |
| H01L 29/45 | (2006.01) |
| H01L 29/49 | (2006.01) |

(52) U.S. Cl.
CPC .......... *H01L 29/45* (2013.01); *H01L 29/4908* (2013.01); *H01L 29/66969* (2013.01); *H01L 29/78603* (2013.01); *H01L 29/78648* (2013.01); *H01L 29/78684* (2013.01); *H01L 29/78696* (2013.01)

(58) Field of Classification Search
USPC ...... 257/27, 29, 42, 183, 194, 347, E21.409, 257/E29.042, E29.242, E29.296; 438/151, 438/157, 212, 285
See application file for complete search history.

(56) References Cited

U.S. PATENT DOCUMENTS

| | | | | |
|---|---|---|---|---|
| 2010/0258787 | A1* | 10/2010 | Chae | H01L 29/0673 257/39 |
| 2013/0105765 | A1* | 5/2013 | Haensch | H01L 29/42364 257/29 |
| 2014/0008616 | A1 | 1/2014 | Geim et al. | |
| 2014/0131698 | A1* | 5/2014 | Kim | H01L 29/78681 257/42 |
| 2014/0183453 | A1* | 7/2014 | Kim | H01L 29/151 257/29 |
| 2014/0231888 | A1* | 8/2014 | Kelber | H01L 29/78 257/295 |
| 2015/0137075 | A1* | 5/2015 | Heo | H01L 27/0922 257/29 |

OTHER PUBLICATIONS

Castellanos-Gomez, A., et al., "Single-Layer MoS2 Mechanical Resonators," Advanced Materials,Dec. 10, 2013, vol. 25, Issue 46, pp. 6719-6723.
Chen, X., et al., "Fully Integrated Graphene and Carbon Nanotube Interconnects for Gigahertz High-Speed CMOS Electronics," IEEE Transactions on Electron Devices, Nov. 2010, vol. 57, No. 11, pp. 3137-3143.
Chen, Z. & Appenzeller, J., "Mobility Extraction and Quantum Capacitance Impact in High Performance Graphene Field-effect Transistor Devices," IEEE IEDM Tech. Digest 21.1, Dec. 2008, pp. 509-512.
Das, S. & Appenzeller, J., "Evaluating the scalability of multilayer MoS2 transistors," IEEE, Jun. 2013, pp. 153-154.
Das, S. & Appenzeller, J., "On the Importance of Bandgap Formation in Graphene for Analog Device Applications," IEEE Transactions on Nanotechnology, Jan. 28, 2011, vol. 10, No. 5, pp. 1093-1098.
Das, S. & Appenzeller, J., "Screening and interlayer coupling in multilayer MoS2," Physica Status Solidi RRL, Mar. 6, 2013, vol. 7, No. 4, pp. 268-273.
Das, S. & Appenzeller, J., "Where Does the Current Flow in Two-dimensional Layered Systems?," Nano Letters, Jun. 26, 2013, vol. 13, pp. 3396-3402.
Das, S. & Appenzeller, J., "WSe2 field effect transistors with enhanced ambipolar characteristics," Applied Physics Letters, Sep. 3, 2013, vol. 103, No. 103501, 5 pages.
Das, S., et al., "High Performance Multilayer MoS2 Transistors with Scandium Contacts," Nano Letters, Dec. 14, 2012, vol. 13, pp. 100-105.
Das, S., et al., "Toward Low-Power Electronics: Tunneling Phenomena in Transition Metal Dichalcogenides," ACS Nano, Jan. 6, 2014, vol. 8, No. 2, pp. 1681-1689.

Dean, C. R., et al., "Boron nitride substrates for high-quality graphene electronics," Nature Nanotechnology, Aug. 22, 2010, vol. 5, pp. 722-726.
Dimitrakopoulos, C. D. & Malenfant, P. R. L., "Organic Thin Film Transistors for Large Area Electronics," Advanced Materials, Jan. 16, 2002, vol. 14, No. 2, pp. 99-117.
Duan, X., et al., "High-performance thin-film transistors using semiconductor nanowires and nanoribbons," Nature, Sep. 18, 2003, vol. 425, pp. 274-278.
Eda, G., et al., "Photoluminescence from Chemically Exfoliated MoS2," Nano Letters, Oct. 28, 2011, vol. 11, pp. 5111-5116.
Engel, M., et al., "Thin Film Nanotube Transistors Based on Self-Assembled, Aligned, Semiconducting Carbon Nanotube Arrays," ACS Nano, Dec. 9, 2008, vol. 2, No. 12, pp. 2445-2452.
Geim, A. K. & Novoselov, K. S., "The rise of graphene," Nature Materials, Mar. 2007, vol. 6, pp. 183-191.
He, Q., et al., "Fabrication of Flexible MoS2 Thin-Film Transistor Arrays for Practical Gas-Sensing Applications," Small, Jul. 6, 2012, vol. 8, No. 19, pp. 2994-2999.
Kamiya, T., et al., "Present status of amorphous In—Ga—Zn—O thin-film transistors," Science and Technology of Advanced Materials, Sep. 10, 2010, vol. 11, No. 044305, 23 pages.
Klauk, H., "Organic thin-film transistors," Chemical Society Reviews, Apr. 16, 2010, vol. 39, pp. 2643-2666.
Kumar, A. & Ahluwalia, P.K., "Electronic structure of transition metal dichalcogenides monolayers 1H-MX2 (M=Mo, W; X=S, Se, Te) from ab-initio theory: new direct band gap semiconductors," The European Physical Journal B, Jun. 6, 2012, vol. 85, No. 186, 7 pages.
Larentis, S., et al., "Field-effect transistors and intrinsic mobility in ultra-thin MoSe2 layers," Applied Physics Letters, Nov. 26, 2012, vol. 101, No. 223104, 4 pages.
Lee, K. H., et al., "Large-Scale Synthesis of High-Quality Hexagonal Boron Nitride Nanosheets for Large-Area Graphene Electronics," Nano Letters, Jan. 5, 2012, vol. 12, pp. 714-718.
Liu, L., et al., "Prformance Limits of Monolayer Transition Metal Dichalocogenide Transitors," IEEE Transactions on Electron Devices, Jul. 22, 2011, vol. 58, No. 9, pp. 3042-3047.
Nathan, A., et al., "Amorphous Silicon Thin Film transistor Circuit Integration for Organic LED Displays on Glass and Plastic," IEEE Journal of Solid-State Circuits, Sep. 2004, vol. 39, No. 9, pp. 1477-1486.
Nomura, K., et al., "Room-temperature fabrication of transparent flexible thin-film transistors using amorphous oxide semiconductors," Nature, Nov. 25, 2004, vol. 432, pp. 488-492.
Palacios, T., "Thinking outside the silicon box," Nature Nanotechnology, Aug. 2011, vol. 6, pp. 464-465.
Podzorov, V., et al., "High-mobility field-effect transistors based on transition metal dichalcogenides," Applied Physics Letters, Apr. 26, 2004, vol. 84, No. 17, pp. 3301-3303.
Powell, M. J., "The Physics of Amorphous-Silicon Thin-Film Transistors," IEEE Transactions on Electron Devices, Dec. 1989, vol. 36, No. 12, pp. 2753-2763.
Radisavljevic, B., et al., "Single-layer MoS2 transistors," Nature Nanotechnology, Jan. 30, 2011, vol. 6, pp. 147-150.
Splendiani, A., et al., "Emergin Photoluminescence in Monolayer MoS2," Nano Letters, Mar. 15, 2010, vol. 10, pp. 1271-1275.
Street, R. A., "Thin-Film Transistors," Advanced Materials, Mar. 4, 2009, vol. 21, pp. 2007-2022.
Tongay, S., et al., "Thermally Driven Crossover from Indirect toward Direct Bandgap in 2D Semiconductors: MoSe2 versus MoS2," Nano Letters, Oct. 25, 2012, vol. 12, pp. 5576-5580.
Wang, H., et al., "Integrated Circuits Based on Bilayer MoS2 Transistors," Nano Letters, Aug. 3, 2012, vol. 12, pp. 4674-4680.
Xia, J., et al., "Measurement of the quantum capacitance of graphene," Nature Nanotechnology, Jul. 5, 2009, vol. 4, pp. 505-509.

* cited by examiner

ALL 2D, HIGH MOBILITY, FLEXIBLE, TRANSPARENT THIN FILM TRANSISTOR

CROSS-REFERENCE TO RELATED APPLICATIONS

This application claims the benefit of U.S. Provisional Application No. 61/982,740 filed on Apr. 22, 2014, which is hereby incorporated by reference in its entirety.

FEDERAL FUNDING STATEMENT

This invention was made with government support under Contract Department of Energy and UChicago Argonne, LLC, under Contract No. DE-AC02-06CH11357. The U.S. Government has certain rights in this invention.

FIELD OF THE INVENTION

The present invention relates generally to the field of thin film transistors (TFTs). More specifically, the present invention relates to fabrication of a high mobility, flexible, transparent, thinnest thin film transistor using all two dimensional (2D) materials layers.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Two dimensional (2D) layered materials like graphene, hexagonal boron nitride (h-BN) and transition metal dichalcogenides (TMDs) are receiving significant attention across all scientific disciplines due to their unique electrical, mechanical, thermal and optical properties. High carrier velocity, exceptional mechanical stability and near invisibility of graphene has already resulted in its commercialization as stretchable and transparent electrodes and interconnects. Graphene has also been substantially investigated as an alternative to silicon for beyond complementary metal-oxide semiconductor (CMOS) nanoelectronics. However, the absence of a sizeable bandgap prevents the use of graphene in logic circuits and has paved the way for the exploration of semiconducting transition metal dichalcogenides (TMDs) including, but not limited to, $MoS_2$, $WSe_2$, and $MoSe_2$. Several high performance field effect transistors (FETs) based on TMDs have been demonstrated. Various studies also indicate the potential of TMDs for optical, mechanical, chemical and thermal applications. Finally, h-BN complements both, highly conductive graphene and semiconducting TMDs, not only by being a large bandgap insulator, but also, often as a substrate with better interface qualities. Integrating the unique properties of these different 2D materials, therefore, provides numerous possibilities to shape the future of nanoelectronics.

One of the most promising applications of optimally stacked 2D materials is as thin film transistors (TFTs). The recent outburst of the display technology has made it even more appealing since the light emitting diodes (LEDs) and liquid crystal displays (LCDs) are driven by TFTs. TFTs are also used in RFID tags, flexible electronic devices and for sensing applications. Although, the thin film transistor industry is reasonably mature, it is nowhere close to the ultimate potential due to limited material choices. Amorphous silicon (a-Si) is the most popular and widely used material for the TFTs, but the mobility of a-Si is in the range of 0.5-1 $cm^2/Vs$. However, the mobility is still found to be less than 1 $cm^2/Vs$ for most cases. Metal oxide semiconductors such as indium tin oxide (ITO), ZnO and most recently alloys such as GaInZnO (GIZO) have demonstrated mobility values as high as 1-100 $cm^2/Vs$, but, the oxide TFTs suffer significantly from threshold voltage shift and hence, electrical instability, due to doping created by oxygen vacancies. Nanowire and carbon nanotube based TFTs have also demonstrated mobility values in the range of 10-100 $cm^2/Vs$. However, the placement of the wires/tubes and the variability in their transport properties depending on their dimensions (diameters) and connectivity (percolation path in a film) are the major challenges in the realization of TFTs using these materials. Therefore, the search for better materials for TFTs continues.

The most desirable features of TFTs are high carrier mobility, high ON-OFF current ratio, low contact resistance, presence of both electron and hole conduction, high optical transparency, temperature stability and mechanical flexibility. 2D layered materials are a natural choice for the TFTs in order to meet these requirements. Moreover, their inherent electrostatic integrity allows them to operate at low power and also make them more scalable.

A need exists for improved technology, including technology that may address the above described disadvantages. In particular, a need exists for improved technology that addresses problems including, but not limited to: 1) low carrier mobility of amorphous silicon TFTs, 2) poor on-off current ratio and low mobility values of organic TFTs, 3) threshold voltage instability of oxide TFTs, 4) variability and placement issues of nanowire and nanotube TFTs, and 5) ability to build TFTs on flexible and optically transparent substrates.

SUMMARY

One embodiment of the invention relates to a method for manufacturing a two-dimensional thin film transistor on a rigid substrate. The method includes layering a semiconducting channel material on a substrate, providing a first electrode material on top of the semiconducting channel material, patterning a source metal electrode and a drain metal electrode at opposite ends of the semiconducting channel material from the first electrode material, opening a window between the source metal electrode and the drain metal electrode, removing the first electrode material from the window located above the semiconducting channel material, providing a gate dielectric above the semiconducting channel material, and providing a top gate above the gate dielectric. The top gate is formed from a second electrode material. The semiconducting channel material is comprised of tungsten diselenide, the first electrode material and the second electrode material are comprised of graphene, and the gate dielectric is comprised of hexagonal boron nitride. In one embodiment, the semiconducting channel material is comprised of tungsten diselenide, the first electrode material and the second electrode material are comprised of graphene, and the gate dielectric is comprised of hexagonal boron nitride.

Another embodiment of the invention relates to a method for manufacturing a two-dimensional thin film transistor on a flexible substrate. The method includes layering a semiconducting channel material on a substrate, providing a first electrode material on top of the semiconducting channel material, patterning a source metal electrode and a drain metal electrode at opposite ends of the semiconducting channel material from the first electrode material, opening a window between the source metal electrode and the drain metal electrode, removing the first electrode material from the window located above the semiconducting channel material, providing a gate dielectric above the semiconducting channel material, and providing a top gate above the gate dielectric. The top gate is formed from a second electrode material. The semiconducting channel material is comprised of tungsten diselenide, the first electrode material and the second electrode material are comprised of graphene, and the gate dielectric is comprised of hexagonal boron nitride. In one embodiment, the semiconducting channel material is comprised of tungsten diselenide, the first electrode material and the second electrode material are comprised of graphene, and the gate dielectric is comprised of hexagonal boron nitride.

Yet another embodiment of the invention relates to a two-dimensional thin film transistor including a substrate, a semiconducting channel material layered on the substrate, a source metal electrode and a drain metal electrode located above the semiconducting channel material, a window between the source metal electrode and the drain metal electrode, a gate dielectric located above the source metal electrode and the drain metal electrode, and a top gate located above the gate dielectric. The source metal electrode and the drain metal electrode are mirror images of one another within a plane. The window is located above the semiconducting channel material. In one embodiment, the semiconducting channel material is comprised of tungsten diselenide, the source metal electrode, the drain metal electrode and the top gate are comprised of graphene, and the gate dielectric is comprised of hexagonal boron nitride. The substrate may be rigid or flexible.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which.

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Figure 1A:
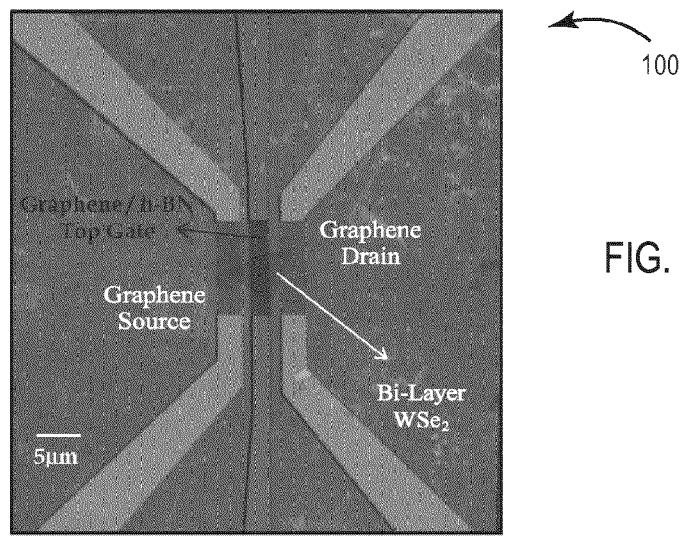
FIG. 1A is a false color SEM image of an all 2D thin film transistor (TFT) including a metal electrode, a gate dielectric and a semiconducting channel material.
Figure 1B:
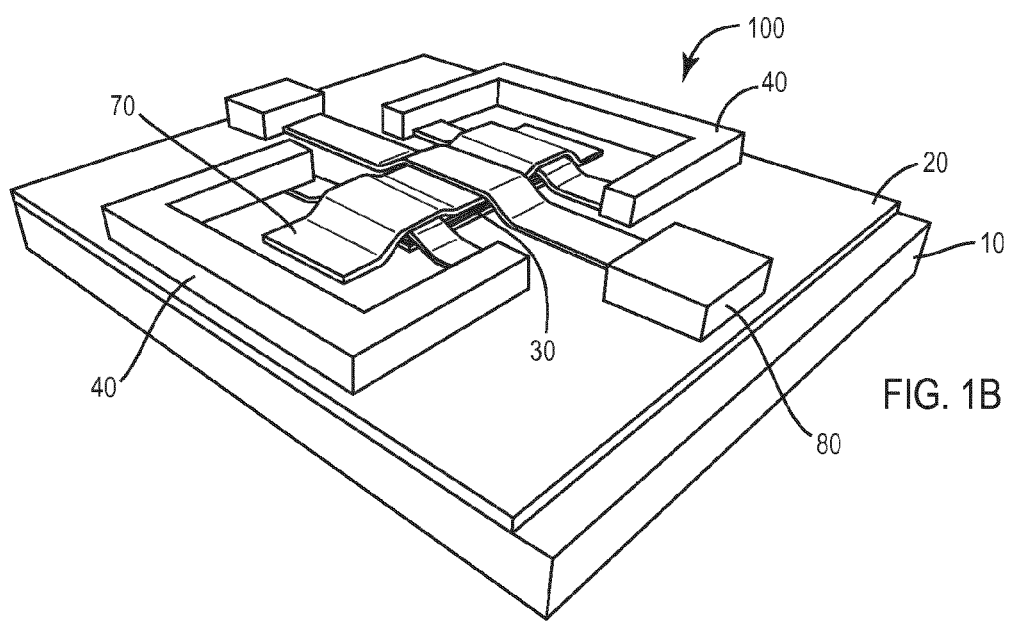
FIG. 1B illustrates a 3D isometric view of the 2D TFT of FIG. 1A.
Figure 1C:
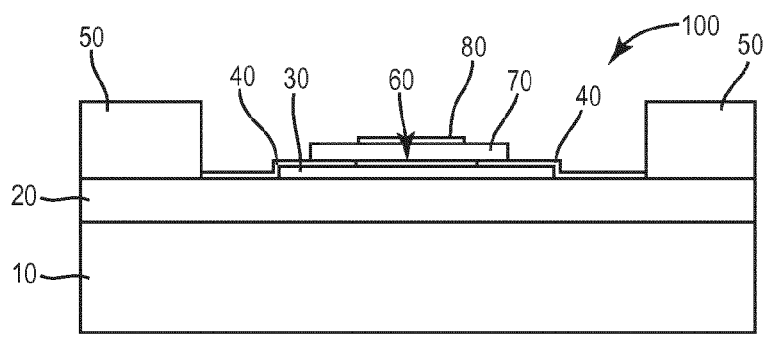
FIG. 1C illustrates a cross sectional view of the 2D TFT of FIG. 1A.

Referring to FIGS. 1A-1C, an all 2D thin film transistor (TFT) 100 includes a back gate electrode 10, a back gate oxide 20, a semiconducting channel material 30, metal electrodes 40, contact pads 50, a window 60, a gate dielectric (insulator) 70, and a top gate 80. The back gate electrode 10 and the back gate oxide 20 comprise a rigid substrate upon which the semiconducting channel material 30, the metal electrodes 40, the contact pads 50, the window 60, the gate dielectric 70 and the top gate 80 are layered.

The back gate electrode 10 may be a layer of highly doped silicon. The back gate oxide 20 may be, for example, silicon dioxide. The semiconducting channel material 30 may be, for example, bi-layers of $WSe_2$. The metal electrodes 40 and/or the top gate 80 may be, for example, monolayer graphene. The contact pads 50 may be, for example, aluminum or any other metal. The gate dielectric 70 may be, for example, 3-4 atomic layers of h-BN. FIG. 1A shows a false color SEM image of an all 2D TFT 100 on a 20 nm $SiO_2$ back gate oxide 20 with highly doped Si as the back gate electrode 10. FIGS. 1B and 1C, respectively, show the three-dimensional isometric view and the cross sectional view of the all 2D TFT 100 of FIG. 1A.

One of ordinary skill in the art would appreciate that all two-dimensional (2D) materials layers are different from either amorphous or crystalline bulk material. The 2D term is generally used if the material is either in a single atomic layer or in a few layers (e.g., 5-7 layers) in crystalline form, since the material's properties are very different from that of bulk material at this level.

Fabrication of TFTs on silicon substrates, glass substrates, and flexible PET substrates involve similar process flows. In the process described below and illustrated in FIGS. 4A and 4B, optical lithography and reactive ion etching (RIE) are used for patterning purposes and electron beam evaporation is used for contact pads metallization.

Figure 4A:
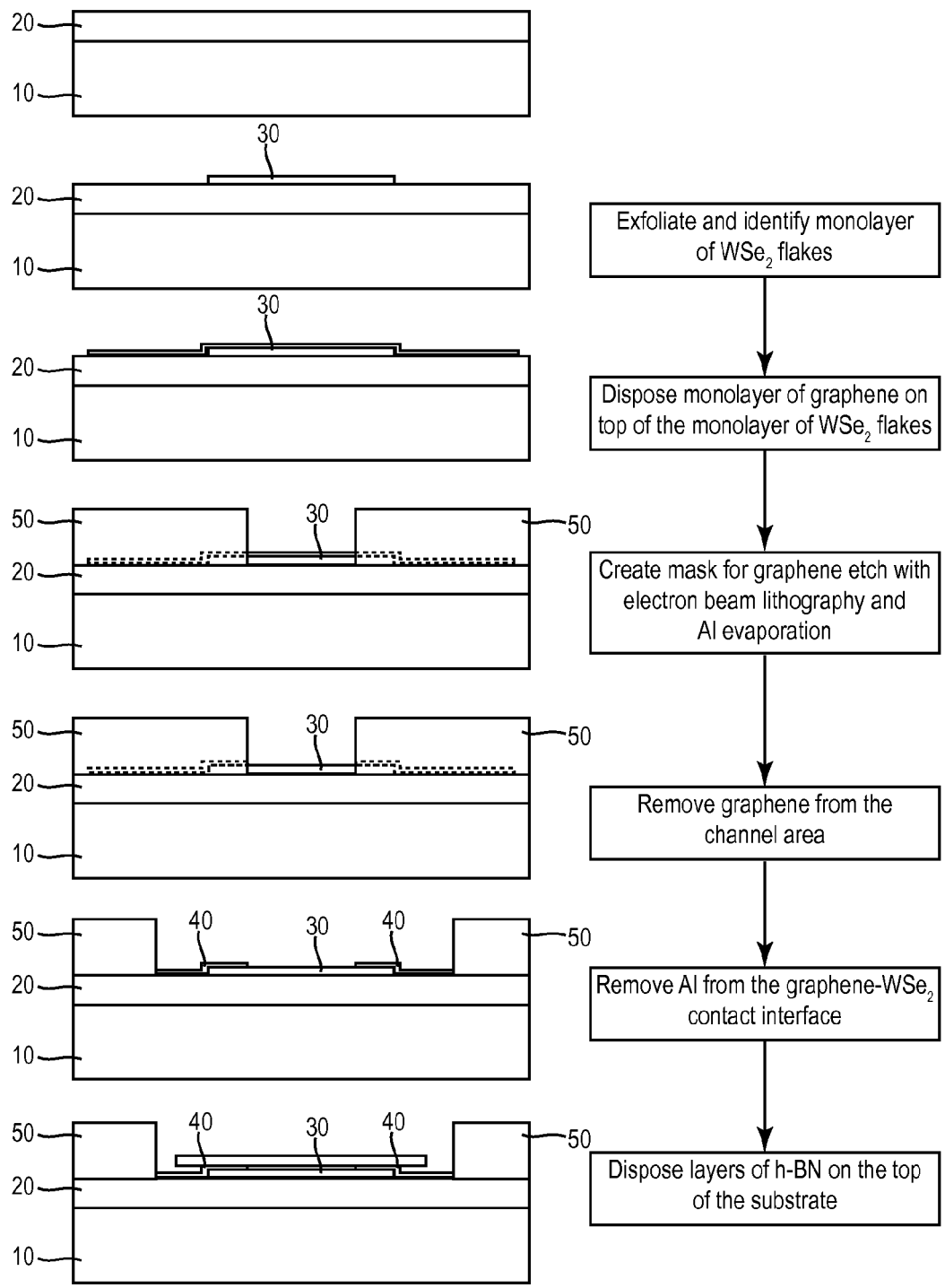
FIGS. 4A and 4B illustrate an exemplary process for fabricating a TFT using all two dimensional (2D) materials layers.
Figure 4B:
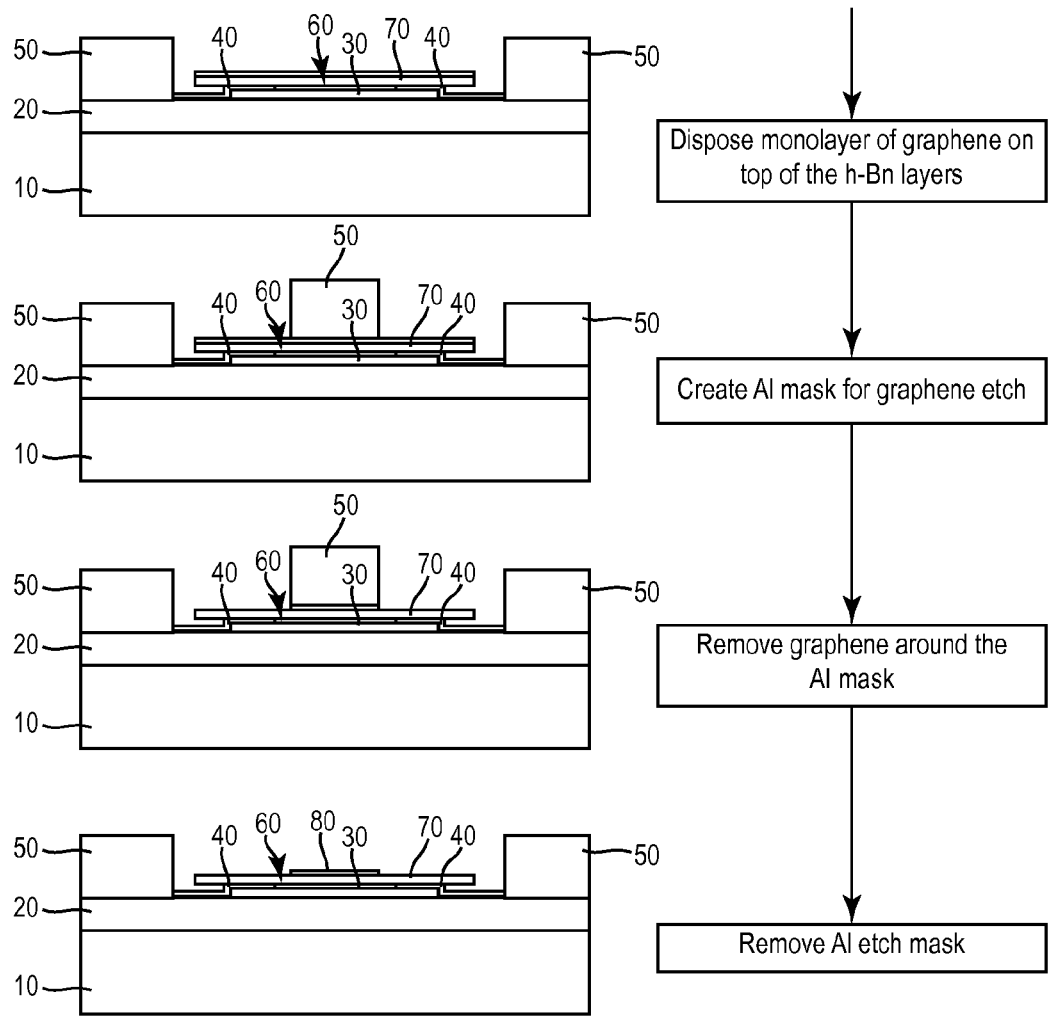

FIGS. 4A and 4B illustrate an exemplary process for fabricating the all 2D TFT 100. In Step 1, $WSe_2$ flakes are mechanically exfoliated using a standard scotch tape technique. One of ordinary skill in the art would appreciate that the standard scotch tape technique involves placing a sample of graphite onto a non-permanently adhesive substrate such as a piece of scotch tape or other sticky paper and then folding and unfolding (i.e., peeling) the adhesive substrate several times to create progressively thinner layers of graphite—eventually leading to a single layer of carbon. In the present application, the standard scotch tape technique has been modified to place a sample of $WSe_2$ onto a non-permanently adhesive substrate. The non-permanently adhesive substrate is then folded and unfolded several times, eventually leading to a bilayer of $WSe_2$ flakes. The bilayer of $WSe_2$ flakes are placed on a 20 nm $SiO_2$ back gate oxide 20 provided on a highly doped Si back gate electrode 10. The $WSe_2$ flakes form the semiconducting channel material 30.

In Step 2, monolayer or a bilayer of graphene grown on copper foil using CVD is transferred on top of the $WSe_2$ flakes 30 using a conventional graphene transfer technique. In a preferred embodiment, monolayer graphene is used for better performance. In Step 3, source/drain metal electrodes 40 are patterned using optical lithography followed by an electron beam evaporation of aluminum (Al) to create Al contact pads 50 for etching. Although Al is not the ideal contact metal for graphene, the fact that Al can be etched with solvents like AZ351 or MF26A makes the fabrication much simpler, as compared to using other metals that require acids for wet etching, which could potentially react with/degrade the $WSe_2$ flakes or graphene. In addition, in the ultimate device geometry, the Al will only serve as the large contact pads for electrical probing and hence the contact resistance at the graphene-to-Al contact can be neglected while evaluating the overall device performance. Although an Al contact pad has been disclosed in this embodiment, one of ordinary skill in the art would understand that any other metal may be used, provided that the etchant to be used will etch the metal selectively without damaging the $WSe_2$ flakes or the graphene.

In Step 4, an oxygen plasma etch is performed to remove graphene from everywhere except the source/drain contact region hard masked by Al. Oxygen plasma etching does not etch the $WSe_2$ flakes 30. In Step 5, optical lithography is used to open a window 60 on top of the $WSe_2$ flakes 30 and then etch Al using AZ351 in order to make a pure graphene contact. For probing the device for electrical characterization, large Al pads are kept intact.

In step 6, a few layers (3-4) of h-BN are grown on copper foil using CVD and are transferred on top of the metal electrodes 40. The h-BN comprises the gate dielectric 70 for the all 2D TFT 100.

In step 7, additional mono/bilayer graphene grown on the copper foil using CVD (see Step 2) is transferred on top of the h-BN 70. The additional mono/bilayer graphene comprises the top gate 80. In step 8, the gate metal electrode (i.e., the mono/bilayer graphene) is patterned using optical lithography and followed by the electron beam evaporation of Al. In step 9, the graphene is oxygen plasma etched. In step 10, the Al etch mask is removed to make a pure graphene top gate 80. For probing the device for electrical characterization, large Al pads are kept intact.

Figure 2A:
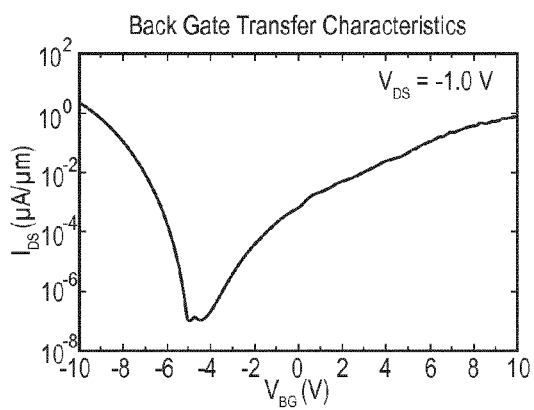
FIG. 2A illustrates back gate transfer characteristics of a $WSe_2$ TFT with graphene as contact electrodes.

FIG. 2A shows the back-gated transfer characteristics of an all 2D TFT with bilayer $WSe_2$ flakes as the semiconducting channel material 30 and graphene as the source/drain contact electrodes 40. Note that all the graphene electrodes 40 are connected to metal pads 50 at both ends to ensure uniform potential landscape across the entire graphene contacts (FIG. 1B). Unlike conventional metal electrodes, the Fermi level of graphene responds to the back gate bias in spite of the charge screening by the $WSe_2$ channel underneath the contacts.

Figure 2B:
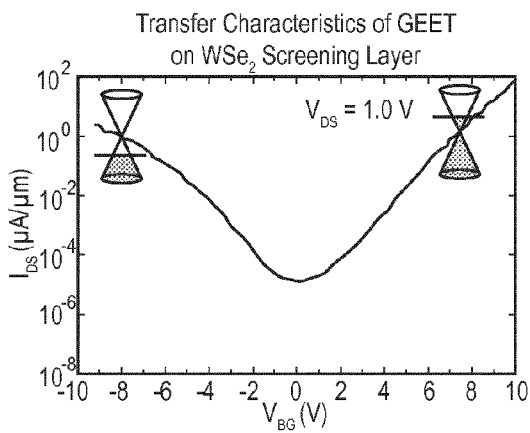
FIG. 2B illustrates back gate transfer characteristics of a graphene field effect transistor (FET) with an underlying $WSe_2$ screening layer.

FIG. 2B shows the transfer characteristics of a graphene field effect transistor (GFET) with underlying $WSe_2$ as the screening layer. The characteristic is very similar to conventional GFET devices which clearly suggest that the underlying $WSe_2$ acts as just an additional dielectric layer.

Figure 2D:
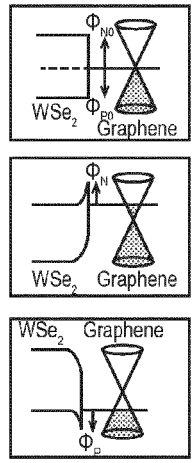
FIG. 2D illustrates band alignment at graphene to $WSe_2$ contact interface at different back gate bias conditions shown in FIG. 2A.
Figure 2C:
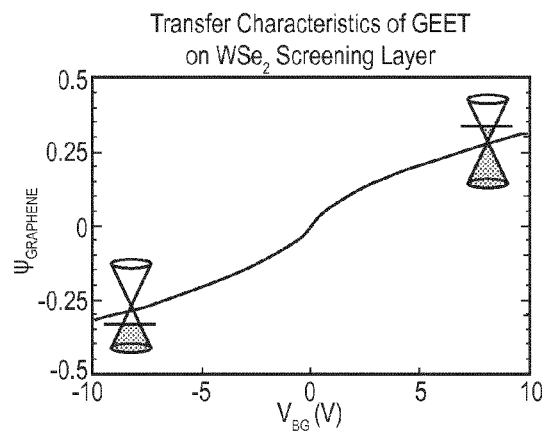
FIG. 2C illustrates band movement ($\Psi_{GRAPHENE}$) in graphene in response to an applied back gate bias.

FIG. 2C shows the position of the Fermi level inside graphene in response to the applied back gate bias screened by bilayer $WSe_2$. The Landauer formalism for current transport has been used and the quantum capacitance contribution has been taken into account in order to solve the self-consistent Poisson equation to calculate $\Psi_{GRAPHENE}$. Details of the calculation can be found in Das, S.; Appenzeller, J. On the Importance of Bandgap Formation in Graphene for Analog Device Applications. 10, 1093-1098 (2011); Lundstrom, M. Nanoscale Transistors: Device Physics, Modeling and Simulation. Springer (2006); and Datta, S. Quantum Transport: Atom to Transistor. Cambridge University Press (2005), the entire contents of which are hereby incorporated by reference in their entireties. Numerical calculations backed by experimental observations suggest that the Fermi level in graphene can be moved by ~300 meV on either side of the Dirac point over the applied gate bias range. This is an important finding in the context of graphene to $WSe_2$ contact as will be discussed next.

Figure 2E:
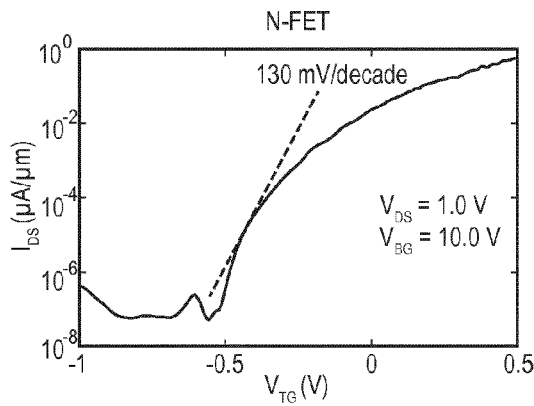
FIGS. 2E and 2F illustrate top gate transfer characteristics of all 2D TFT corresponding to two different back gate biases, $V_{BG}$=10V and $V_{BG}$=−10V, respectively.
Figure 2F:
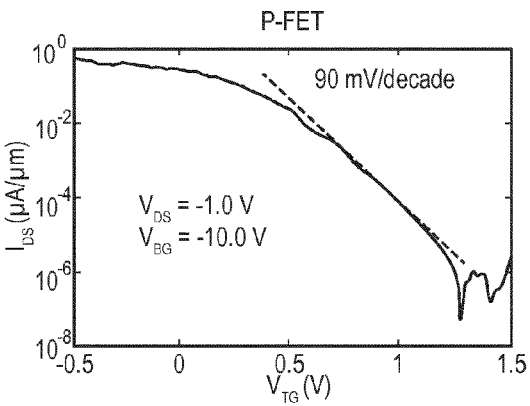

The presence of both the electron and the hole conduction in the $WSe_2$ thin film transistor (FIG. 2A) strongly suggest that the Dirac point of graphene aligns close to the middle of the bandgap of $WSe_2$. Since the bandgap of bilayer $WSe_2$ is ~1.3 eV, this would indicate the existence of large Schottky barrier heights at graphene to $WSe_2$ contacts for both electron injection into the conduction band ($\Phi_{N0}$) and hole injection into the valence band ($\Phi_{P0}$) as shown in the associated band diagram in FIG. 2D (brown box). When a negative gate bias is applied, the energy bands in $WSe_2$ bend to facilitate hole injection into the valence band and at the same time the Fermi level in graphene also moves into the valence band, thereby reducing the effective Schottky barrier height for hole injection to $\Phi_P$ as shown in the purple box in FIG. 2D. Similarly for positive gate bias, the energy bands in $WSe_2$ bend to facilitate electron injection into the conduction band and at the same time the Fermi level in graphene also moves into the conduction band, thereby reducing the effective Schottky barrier height for electron injection to $\Phi_N$ as shown in the black box in FIG. 2D. Using the technique proposed by Das (see Das, S.; Appenzeller, J. WSe2 field effect transistors with enhanced ambipolar characteristics. *Applied Physics Letters* 103, 103501 (2013), the entire contents of which is hereby incorporated by reference in its entirety), and adjusting the effective bandgap of $WSe_2$ to take into account the band movement in graphene, the height of the Schottky barrier at the graphene-to-$WSe_2$ contact was extracted to be 0.38 eV for the electron injection into the conduction band and 0.22 eV for the hole injection into the valence band at threshold bias condition. FIGS. 2E and 2F show the partially top gated transfer characteristics of the same TFT with h-BN as the gate dielectric 70 and graphene as the gate electrodes 40 corresponding to two different biasing condition of the back gate, $V_{BG}=10V$ and $V_{BG}=-10V$ respectively. For negative back gate biases the $WSe_2$ flake 30 is electrostatically p-doped and hence the top gated device exhibits p-FET characteristics. While for positive back gate biases the $WSe_2$ flake 30 is electrostatically n-doped and hence the top gated device exhibits n-FET characteristics. The subthreshold slope was found to be ~90 mV/decade for the p-FET and ~130 mV/decade for the n-FET.

The field effect mobility values were extracted using the conventional equation for $g_m=\mu C_{OX}(W/L)V_{DS}$ (where, $g_m$ is the trans-conductance, $\mu$ is the field effect mobility and W and L are the channel width and the channel length respectively, $C_{OX}=\epsilon_{OX}/d_{OX}$, where $\epsilon_{OX}$ is the dielectric constant and $d_{OX}$ is the thickness of the gate oxide, $d_{OX}=3$ nm and for h-BN, $\epsilon_{OX}=6.10^{-11}$, which gives $C_{OX} \sim 3.10^{-2}$ F/m$^2$, and finally L~5 μm) from the back gated device characteristics. The field-effect mobility values were found to be 24 and 45 cm$^2$/Vs for electrons and holes, respectively. It is noted that the mobility of amorphous Si is in the range of 0.5-1 cm$^2$/Vs while the mobility of most of the organic semiconductors is <1 cm$^2$/Vs. Applicant's mobility values, therefore, outperform the state of the art TFT technologies by ~2 orders of magnitude. Metal oxide semiconductors like indium tin oxide (ITO), ZnO and most recently alloys like InGaZnO (IGZO) had demonstrated mobility values as high as 1-100 cm$^2$/Vs, but, the oxide TFTs suffer significantly from threshold voltage shift and hence electrical instability due to doping created by oxygen vacancies. Applicant's all 2D TFTs show remarkable threshold voltage stability when measured in vacuum and air as well as over a span of time. Nanowire and Carbon Nanotube based TFTs had also demonstrated mobility values in the range of 10-100 cm$^2$/Vs. However, the placement of the wires/tubes and the variability in their transport properties depending on their dimensions (diameters) and connectivity (percolation path in a film) are the major challenges in the realization of TFTs using these materials. The fact that the 2D materials can be grown over a large area eliminates the placement problem and at the same time their natural sheet like structure keeps the diffusive transport models applicable in order to benchmark their performance limits.

The drive current ($I_{DRIVE}$) is another important parameter for the TFTs in the context of LEDs and LCDs. Depending upon the material and the desired brightness, a single pixel of an organic LED requires 1-10 μA of current. Note that this drive current is easily achieved in the all 2-D TFTs at a drive voltage of as low as $V_{DS}=V_{GS}=1V$. Also note that in some embodiments, the experimental prototype device is not scaled properly (channel lengths are in several μm). A properly scaled device can have much higher drive current densities at even lower voltages. This will allow reduction of active device area for the TFTs. Moreover, a single TFT can potentially drive several LEDs, which will reduce cost, power dissipation as well as open up avenues for innovative circuit design.

The drive current is also important in the context of LCDs. The charging time of a pixel is inversely proportional to the drive (charging) current ($\tau=V_{DD}C_{PIXEL}/I_{DRIVE}$, where $\tau$ is the charging time, $V_{DD}$ is the supply voltage and $C_{PIXEL}$ is the pixel capacitance). For a standard pixel capacitance in the range of 0.1-1 pF, the all 2D TFTs will have a charging time of 0.1-1 μs. The resolution of an LCD ($\beta=V_{DD}C_{PARA}/C_{PIXEL}$, where $C_{PARA}$ is the parasitic capacitance) can also be significantly enhanced by using the all 2D TFT. For a standard parasitic capacitance of 50 fF, resolution of 5-50 mV can be achieved. Finally a figure of merit ($\gamma=\tau^{-1}\beta^{-1}$) as high as $10^8$-$10^{10}$ can be obtained which is 2-4 orders of magnitude higher than the state of the art a-Si TFTs.

One of the major reasons for fabricating the all 2D TFT on silicon platform is to demonstrate high degree of compatibility with the conventional CMOS technology. As the fundamental limitations do not allow Si to scale below 10 nm technology node without compromising sevelry on the device performance, low dimensional materials, especially 2D semiconducting transistion metal dichalcogenides (TMDs) will become more and more relevant in the context of high performance CMOS as well. Earlier studies related to channel length scaling, good quality contact formation and layer thickness optimization of TMDs has shown a lot of promise. Applicant has also implemented low power device concepts like tunneling FETs with the TMDs. There is a widespread concern about the low mobility values of the TMDs impacting the ON state performance of FETs. However, for technology nodes beyond 10 nm, the devices will be dominated by ballistic transport and hence the more important parameters are going to be the carrier injection velocity and density of conducting modes. While carrier injection velocity of the TMDs are very similar to Si, the number of conducting modes for the TMDs far exceed Si due to their large effective masses (by a factor of 2-3). Moreover, the quatum effects (mostly reflected in increasing the bandgap of Si) will be absent when the channel thickness is scaled down for the TMDs. One of the major concerns for scaled transistors based on low dimensional materials is the non-scalability of contact resistance due to finite transfer length and schottky barrier at the interface with the metal electrode. However, it has clearly been demonstrated that such contact reistance values can be significantly reduced by using graphene as the electrode material.

In the embodiment described above, a 10 atomic layer thick, all 2D, high mobility, transparent thin film transistor (TFT) device with ambipolar device characteristics is fabricated on a substrate 10 comprised of a silicon substrate (e.g., a silicon dioxide substrate), a flexible glass substrate, or a flexible polyethylene terephthalate (PET) substrate. Monolayer graphene is used as metal electrodes 40, 3-4 atomic layers of h-BN is used as a gate dielectric 70 and bi-layers of tungsten diselenide (WSe$_2$) are used as a semiconducting channel material 30 for the TFT 100. The field effect carrier mobility was extracted to be 24-45 cm$^2$/Vs, which exceeds mobility values of state of the art amorphous silicon based TFTs by ~100 times. The active device stack of WSe$_2$-h-BN-graphene is greater than or equal to 88% transparent over an entire visible spectrum and the device characteristics are unaltered for in-plane mechanical strain of up to 2%. The device demonstrates temperature stability over 77-400K. A low contact resistance value of 1.2-1.4 kΩ-μm, a subthreshold slope of 90-130 mv/decade, a current ON-OFF ratio of 10$^6$-10$^7$ and a presence of both electron and hole conduction are observed in the TFT, which are extremely desirable but rarely reported characteristics of most of the organic and inorganic TFTs.

Referring now to FIGS. FIG. 3A-3F, in another embodiment of a 2D thin film transistor, the 2D thin film transistor is fabricated on a flexible substrate 90, for example, a flexible glass substrate or a flexible polyethylene terephthalate (PET) substrate. Flexible electronics is another burgeoning industry with a lot of promise. The fact that most of the 2D materials are mechanically stable, make them the natural choice for flexible electronics. When a flexible substrate is utilized, the 2D thin film transistor does not include the back gate electrode 10 and the back gate oxide 20 described in previous embodiments. One of ordinary skill in the art would understand that the remaining elements, namely the semiconducting channel material 30, the metal electrodes 40, the contact pads 50, the window 60, the gate dielectric 70, and the top gate 80 are the same as described in the previous embodiments. In addition, the 2D thin film transistor is fabricated according to the same process described in FIGS. 4A and 4B, with the exception that when the flexible substrate 90 is utilized, the 2D thin film transistor does not include the back gate electrode 10 and the back gate oxide 20 illustrated in FIGS. 4A and 4B.

Figure 3A:
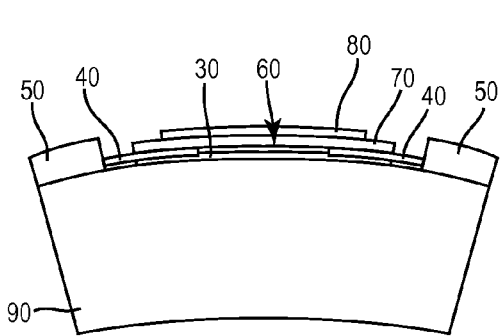
FIG. 3A illustrates an all 2D TFT fabricated on a flexible PET substrate.
Figure 3B:
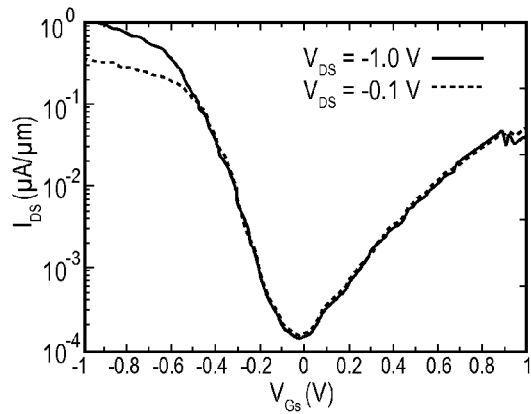
FIG. 3B illustrates transfer characteristics of the TFT of FIG. 3A.
Figure 3C:
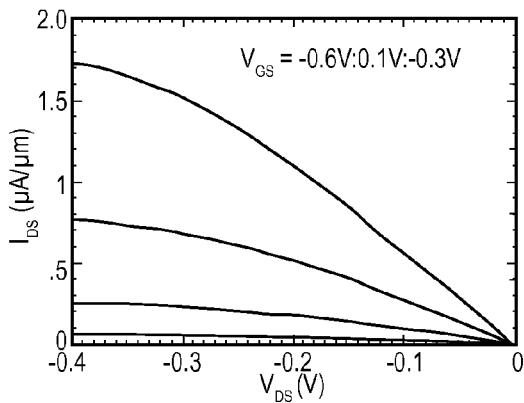
FIG. 3C illustrates output characteristics of the TFT of FIG. 3A.
Figure 3D:
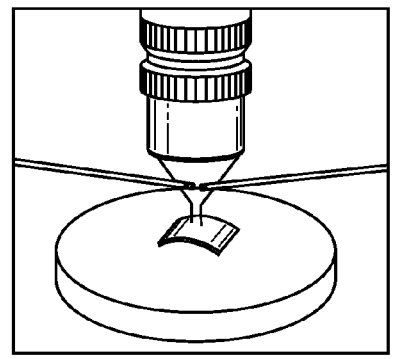
FIG. 3D illustrates an experimental setup to measure the strain effect of the TFT of FIG. 3A.
Figure 3E:
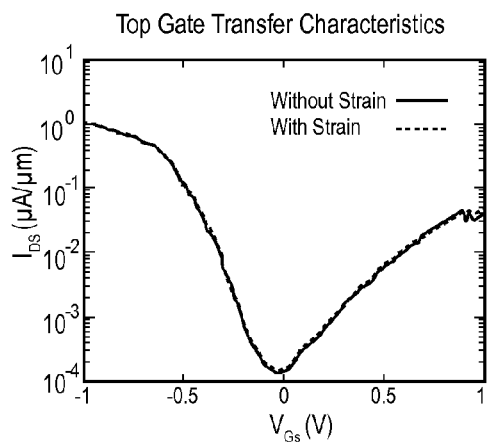
FIG. 3E illustrates device characteristics under strain of the TFT of FIG. 3A.
Figure 3F:
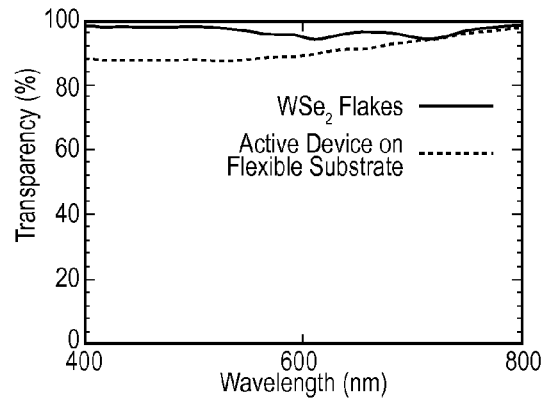
FIG. 3F illustrates the transparency of the TFT of FIG. 3A and its individual components.

FIGS. 3B and 3C show the transfer and output characteristics of fully top gated device (note that the TFTs on flexible substrates does not have any back-gate and, therefore, require overlap of the gate electrode with the source/drain electrodes in order to eliminate access resistance to the channel). The contact resistance values for the p-FET was extracted to be 1.4 kΩ-μm for a gate over-drive voltage of $V_{GS}-V_{TH}=1.0$ V. The contact resistance was calculated based on the extracted Schottky barrier height and the band bending length λ by using Landauer formula for current transport. The low values for contact resistances are extremely encouraging. These numbers may be surprising given that the heights of the Schottky barriers ($\Phi_P=0.22$ eV) at the graphene-to-WSe$_2$ contacts are significantly large. However, it should be noted that in a Schottky barrier field effect transistor the ON-state current is dominated by tunneling through the barrier. The fact that Applicant is using 3 nm h-BN (EOT=1.8 nm) as the gate dielectric and 1.5 nm WSe$_2$ flake as the channel material, results in a tunneling distance of λ=1.6 nm, which makes the barrier almost transparent to the charge carriers. The tunneling distance λ is calculated as the geometric mean of the oxide thickness and channel thickness in an ultra-thin geometry. The sub-threshold slope was found to be ~180 mV/decade for the hole branch and ~340 mV/decade for the electron branch. The device characteristics were also measured with and without strain using an arrangement shown in FIG. 3D. It was encouraging to find that the device characteristics were unaltered even with 2% in-plane mechanical strain as shown in FIG. 3E. It is difficult to confirm the invariability of the material properties (more specifically the electronic band structure of WSe$_2$) as a function of strain from this experiment since it is well know that most of the 2D materials have weak adhesion to the substrates and therefore could slide under strain. Finally, Applicant measured the absorbance of visible light for the all 2D thin film transistor and found that it is ~88% transparent over the entire spectrum. The absorbance of WSe$_2$ flakes was found to be less than 5%.

Applicant has experimentally demonstrated the thinnest, high performance, flexible and transparent thin film transistor fabricated using only all two dimensional layered materials for the first time. The all 2D TFT outperforms the state of the art a-Si TFT in mobility, drive current capability and charging time. Applicant has also extracted very low contact resistance values and subthreshold slopes. The presence of both electron and hole conduction is another unique feature of the all 2D TFTs. In summary, the all 2D exhibited the following advantageous features: 1) high mobility (45 cm$^2$/Vs), 2) high drive current density (1 μA/μm) (useful for TFTs for LEDs), 3) faster charging time (0.1-1 ps) (useful for LCDs), 4) large current on-off ratio (10$^7$), 5) low contact resistance (1.4 kΩ-μm), 6) presence of both electron and hole conduction (with a possibility for complementary logic), 7) mechanical flexibility up to 2% in-plane strain, 8) 88% transparency over an entire visible spectrum and 9) ultra-thin dimensions to enable aggressive scaling.

By directly fabricating back-end-of-line functionality (conducting and insulating), photo-resist steps are eliminated. In semiconductor fabrication everything that's exposed to light is sacrificial, and this invention changes this to enable direct patterning the device. Since the method utilizes spin coating, 3D conformal may be possible. This may also be an enabler for cost-effective printed circuits/batteries. It is a very delicate and low temperature way of building nano/micron scale structures all the way up to practical-world 3D printer scale, potentially enabling new manufacturing approaches.

The construction and arrangements of the thin film transistor, as shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, image processing and segmentation algorithms, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

What is claimed is:

1. A method for manufacturing a two-dimensional thin film transistor, the method comprising:
  layering a semiconducting channel material on a substrate;

providing a first electrode material on top of the semiconducting channel material;

patterning a source metal electrode and a drain metal electrode at opposite ends of the semiconducting channel material from the first electrode material;

opening a window between the source metal electrode and the drain metal electrode;

removing the first electrode material from the window located above the semiconducting channel material;

providing a gate dielectric above the semiconducting channel material; and providing a top gate above the gate dielectric, the top gate formed from a second electrode material, wherein each of the semiconducting channel material, the source metal electrode, the drain metal electrode, and the gate dielectric is comprised of one to seven atomic layers in crystalline form.

2. The method of claim 1, wherein the semiconducting channel material is comprised of tungsten diselenide;

the first electrode material and the second electrode material are comprised of graphene; and the gate dielectric is comprised of hexagonal boron nitride.

3. The method of claim 1, wherein the semiconducting channel material is comprised of a bilayer of tungsten diselenide prepared by placing a sample of tungsten diselenide onto a non-permanently adhesive substrate and then folding and unfolding the non-permanently adhesive substrate a plurality of times, thereby creating progressively thinner layers of tungsten dislenide, until the bilayer of tungsten diselenide remains on the non-permanently adhesive substrate.

4. The method of claim 1, wherein patterning the source metal electrode and the drain metal electrode comprises using optical lithography followed by an electron beam evaporation of aluminum to create an aluminum mask for etching.

5. The method of claim 4, wherein opening the window between the source metal electrode and the drain metal electrode comprises:

using oxygen plasma etching to remove the first electrode material from everywhere except a source metal electrode/drain metal electrode region hard masked by the aluminum mask; and using optical lithography to open the window and remove the aluminum mask from areas in which the source metal electrode and the drain metal electrode contact the semiconducting channel material.

6. The method of claim 1, wherein the top gate is patterned using optical lithography followed by an electron beam evaporation of aluminum to create a top gate aluminum mask for etching.

7. The method of claim 6, wherein providing the top gate above the gate dielectric comprises:

using oxygen plasma etching to remove the second electrode material from everywhere except a gate dielectric/top gate region hard masked by the aluminum mask; and removing the top gate aluminum mask.

8. The method of claim 1, wherein the substrate a rigid substrate comprised of a back gate electrode and a back gate oxide layered on the back gate electrode, and the semiconducting channel material is layered on the back gate oxide.

9. The method of claim 8, wherein the back gate electrode is comprised of highly doped silicon and the back gate oxide is comprised of silicon dioxide.

10. The method of claim 1, wherein the substrate is a flexible substrate comprised of a flexible glass or a flexible polyethylene terephthalate (PET).

11. A two-dimensional thin film transistor comprising:

a substrate;

a semiconducting channel material layered on the substrate;

a source metal electrode and a drain metal electrode located above the semiconducting channel material, the source metal electrode and the drain metal electrode being mirror images of one another within a plane;

a window between the source metal electrode and the drain metal electrode, the window being located above the semiconducting channel material;

a gate dielectric located above the source metal electrode and the drain metal electrode; and a top gate located above the gate dielectric, wherein each of the semiconducting channel material, the source metal electrode, the drain metal electrode, and the gate dielectric is comprised of one to seven atomic layers in crystalline form.

12. The two-dimensional thin film transistor of claim 11, wherein the semiconducting channel material is comprised of tungsten diselenide;

the source metal electrode, the drain metal electrode and the top gate are comprised of graphene; and the gate dielectric is comprised of hexagonal boron nitride.

13. The two-dimensional thin film transistor of claim 12, wherein a field effect carrier mobility is 24-45 $cm^2/Vs$.

14. The two-dimensional thin film transistor of claim 12, wherein a stack comprised of the tungsten diselenide, hexagonal boron nitride, and the graphene is greater than or equal to 88% transparent over an entire visible spectrum.

15. The two-dimensional thin film transistor of claim 12, wherein the two-dimensional thin film transistor has a temperature stability over 77-400K.

16. The two-dimensional thin film transistor of claim 12, wherein the two-dimensional thin film transistor has a contact resistance value of 1.2-1.4 k$\Omega$-$\mu$m.

17. The two-dimensional thin film transistor of claim 12, wherein the two-dimensional thin film transistor has a current ON-OFF ratio of $10^6$-$10^7$.

18. The two-dimensional thin film transistor of claim 12, wherein the two-dimensional thin film transistor has a subthreshold slope of 90-130 mv/decade.

19. The two-dimensional thin film transistor of claim 11, wherein the semiconducting channel material is comprised of a bilayer of tungsten diselenide, and the gate dielectric is comprised of three to four atomic layers of hexagonal boron nitride.

20. The two-dimensional thin film transistor of claim 11, wherein the substrate is a rigid substrate comprised of a back gate electrode and a back gate oxide layered on the back gate electrode, and the semiconducting channel material is layered on the back gate oxide.

21. The two-dimensional thin film transistor of claim 20, wherein the back gate electrode is comprised of highly doped silicon and the back gate oxide is comprised of silicon dioxide.

22. The two-dimensional thin film transistor of claim 11, wherein the substrate is a flexible substrate comprised of a flexible glass or a flexible polyethylene terephthalate (PET).

23. The two-dimensional thin film transistor of claim 11, wherein the semiconducting channel material is layered directly on the substrate.

* * * * *